(12) United States Patent
Williams et al.

(10) Patent No.: US 10,416,206 B2
(45) Date of Patent: Sep. 17, 2019

(54) METHOD OF EVALUATING CHANGE IN ENERGY CONSUMPTION DUE TO VOLT VAR OPTIMIZATION

(71) Applicants: BATTELLE MEMORIAL INSTITUTE, Richland, WA (US); AMERICAN ELECTRIC POWER COMPANY, INC., Columbus, OH (US)

(72) Inventors: Tess L. Williams, Seattle, WA (US); Kevin P. Schneider, Seattle, WA (US); Michael T. Campbell, Springdale, AR (US); Derek S. Lewellen, Tulsa, OK (US)

(73) Assignees: Battelle Memorial Institute, Richland, WA (US); American Electric Power Company, Inc., Columbus, OH (US)

( * ) Notice: Subject to any disclaimer, the term of this patent is extended or adjusted under 35 U.S.C. 154(b) by 298 days.

(21) Appl. No.: 14/870,525

(22) Filed: Sep. 30, 2015

(65) Prior Publication Data
US 2016/0091539 A1 Mar. 31, 2016

Related U.S. Application Data

(60) Provisional application No. 62/057,505, filed on Sep. 30, 2014.

(51) Int. Cl.
| | |
|---|---|
| *G01R 21/133* | (2006.01) |
| *H04Q 9/00* | (2006.01) |
| *H02J 13/00* | (2006.01) |
| *G01R 21/00* | (2006.01) |
| *G01R 22/06* | (2006.01) |

(52) U.S. Cl.
CPC ............ *G01R 21/133* (2013.01); *H02J 13/00* (2013.01); *H04Q 9/00* (2013.01); *G01R 21/002* (2013.01); *G01R 22/063* (2013.01); *H04Q 2209/826* (2013.01)

(58) Field of Classification Search
None
See application file for complete search history.

(56) References Cited

U.S. PATENT DOCUMENTS

| | | | | |
|---|---|---|---|---|
| 6,675,071 | B1 * | 1/2004 | Griffin, Jr. | ......... G01R 19/2513 340/661 |
| 2009/0187284 | A1 * | 7/2009 | Kreiss | .................... G06Q 50/06 700/291 |
| 2012/0004871 | A1 * | 1/2012 | Tsao | ................... G01R 19/2513 702/61 |

(Continued)

OTHER PUBLICATIONS

Schneider, K. P., et al., Evaluation of Conservation Voltage Reduction (CVR) on a National Level, PNNL-19596, Pacific Northwest National Laboratory, Richland, Washington, Jul. 2010.

(Continued)

*Primary Examiner* — Herve-Louis Y Assouman
(74) *Attorney, Agent, or Firm* — Colby Nipper PLLC

(57) ABSTRACT

A method of evaluating an optimization system is disclosed. The system is transitioned from an on state to an off state. Data is collected at time intervals for a time period before and after the system is transitioned from the on state to the off state. The transitioning occurs while a load of a particular type is active. In one embodiment, the optimization system is a Volt/VAR Optimization (VVO) system.

20 Claims, 11 Drawing Sheets

(56) References Cited

U.S. PATENT DOCUMENTS

| 2012/0182157 A1* | 7/2012 | Carr | H04Q 9/00 340/870.02 |
|---|---|---|---|
| 2013/0030599 A1* | 1/2013 | Milosevic | H02J 3/14 700/298 |
| 2013/0238266 A1* | 9/2013 | Savvides | G06Q 50/06 702/61 |

OTHER PUBLICATIONS

Schneider, K. P., et al., Evaluation of Representative Smart Grid Investment Grant Project Technologies: Distribution Automation, PNNL-20546, Pacific Northwest National Laboratory, Richland, Washington, Feb. 2012.

* cited by examiner

METHOD OF EVALUATING CHANGE IN ENERGY CONSUMPTION DUE TO VOLT VAR OPTIMIZATION

CROSS-REFERENCE TO RELATED APPLICATIONS

This application claims priority to U.S. Provisional Application Ser. No. 62/057,505, filed Sep. 30, 2014, titled "Development of Method for Evaluating Benefits of Volt VAR Control and Verification," hereby incorporated by reference in its entirety for all of its teachings.

STATEMENT REGARDING FEDERALLY SPONSORED RESEARCH OR DEVELOPMENT

This invention was made with Government support under Contract DE AC0576RL 01830 awarded by the U.S. Department of Energy. The Government has certain rights in the invention.

TECHNICAL FIELD

This invention relates to Volt/VAR Optimization (VVO) systems. More specifically, this invention relates to a more efficient method of evaluating the effectiveness of a VVO system by using the change in active power demand through a small number of transitions from a VVO-on state to a VVO-off state.

BACKGROUND

Volt/VAR Optimization (VVO) is a utility-centric technology that focuses on the coordinated control of tap changers, voltage regulators, and shunt capacitors to achieve a global objective or objectives. The most common global objectives are the reduction of end-use energy and the regulation of power factor to a specified value. To achieve these goals, a general VVO system uses a combination of Conservation Voltage Reduction (CVR), which is achieved through the control of tap changers and voltage regulators, and power factor control, which is achieved through the control of shunt capacitors. When properly implemented, these systems will provide end-use customers with the same quality of service while reducing annual energy consumption. An increase in the efficiency of the system can also be achieved via reduced system losses, but it is a small effect compared to reductions at the end-use. The end result of a properly operated VVO system is lower energy usage and a more efficient system. Others systems may take a simpler approach of implementing CVR alone.

A VVO system has two main functional components. The first, and primary, function is the coordination of tap changers and voltage regulators, at the feeder level, to reduce energy consumption. The second function is the coordination of capacitors with a weighted dual objective of voltage flattening and power factor correction. In this system, the weighting of the voltage flattening is slightly higher than the weighting for power factor optimization.

One challenge that utilities face with VVO is verifying/validating the effectiveness of the system to their regulating authority. The validation of performance is generally achieved with a 60 or 90 day on/off evaluation process which requires the VVO system to be turned on or turned off on alternate days for the 60 or 90 day period, and is expensive and complicated. The 60 or 90 days evaluation period is required because of VVOs interaction with end-use loads that have thermal control loops, e.g. heating and cooling.

Generally outside firms are hired by utilities to conduct the evaluations, and execute the analysis. Commonly used VVO analysis protocol requires the VVO system to be turned on and off on alternate days for 90 days. Thus, during half of the evaluation process the system is off for testing purposes, representing a loss of benefits. The active power demand is adjusted to control for factors that affect the demand such as temperature, day of week, time of day, and on-days and off-days are compared to estimate the energy reduction achieved by the VVO system. Large amounts of data must be collected, and the analysis requires temperature correction of active power demand. As VVO deployments becomes more common and new installations require evaluation, the development of a simpler method, which requires a shorter period of data collection, to benchmark new evaluations would save time and money.

SUMMARY

The present invention is directed to a method of evaluating an optimization system. The method includes transitioning the system from an on state to an off state; and collecting data at time intervals for a time period before and after the system is transitioned from the on state to the off state.

In one embodiment, the transitioning is performed at least twice a day and completed in approximately 5 to 15 minutes. The data may be collected at, but not limited to, 10 to 60 second time intervals.

The method may further include applying a filter to smooth the data.

In one embodiment, the optimization system is a Volt/VAR Optimization (VVO) system, and the VVO system includes a conservation voltage reduction (CVR) system. In another embodiment, the optimization system is a CVR alone. Other optimization systems may be used with methods of the Present Invention.

The evaluation may be carried out over multiple weeks, but other time ranges for evaluation purposes are possible.

In another embodiment of the present invention, a method of evaluating the change in energy consumption due to the action of a VVO system is disclosed. The method includes transitioning the system from an on state to an off state. The method also includes collecting data at time intervals for a time period before and after the system is transitioned from the on state to the off state, wherein the transitioning occurs while a load of a particular type is active.

DETAILED DESCRIPTION OF THE PREFERRED EMBODIMENTS

Figure 1:
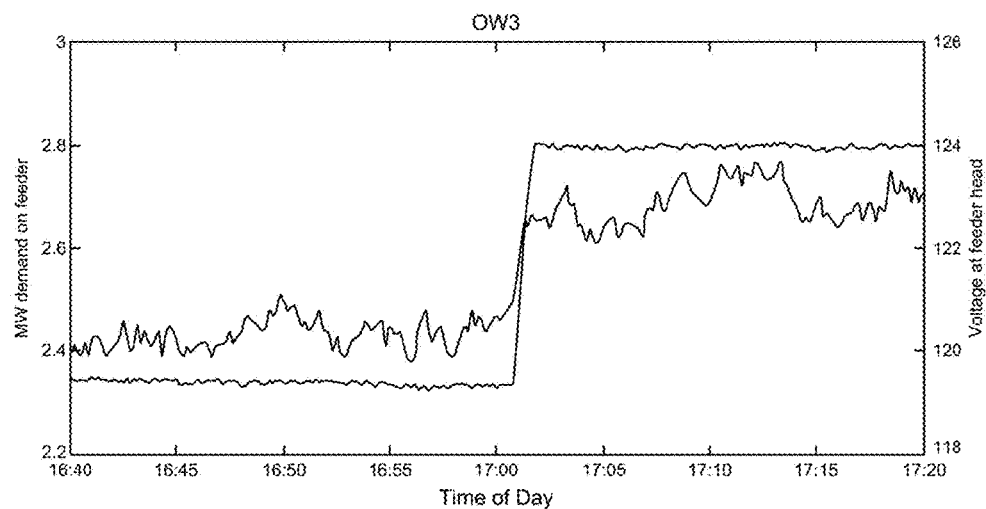
FIG. 1 shows power demand and voltage for a single on→off transition on a feeder with a VVO system, an example when the change in power demand in a single transition is larger than the ambient level of noise.

The following description includes the preferred best mode of embodiments of the present invention. It will be clear from this description of the invention that the invention is not limited to these illustrated embodiments but that the invention also includes a variety of modifications and embodiments thereto. Therefore the present description should be seen as illustrative and not limiting. While the invention is susceptible of various modifications and alternative constructions, it should be understood, that there is no intention to limit the invention to the specific form disclosed, but, on the contrary, the invention is to cover all modifications, alternative constructions, and equivalents falling within the spirit and scope of the invention as defined in the claims.

The present invention includes methods and systems that allow utilities to perform Volt/VAR Optimization evaluation in a shorter time scale and in-house, compared to existing evaluation processes, thus reducing costs and time consumption.

The methods disclosed herein effectively reduce the evaluation time, and allow for the possibility of a continuous commission system. The ability to integrate the solution into a continuous evaluation/commissioning scheme is a major improvement over existing evaluation methods. This capability would be of extreme value during rate filing discussions with regulatory authorities.

The methods of the present invention take less time than currently common evaluation methods and systems. Second, because of the short duration of the transition, the load composition can be assumed to be approximately constant throughout the transition period, and it does not require a complex temperature correction, making the evaluation methods of the present invention suitable for integration into an automated process embedded in a commercially available control system.

The present invention uses the change in active power demand at the point of a transition from VVO-on state to VVO-off state to evaluate the energy reduction capability of the system, which includes calculating the change in energy consumption due to the operation of the VVO system.

The evaluation method uses only data from a brief time period surrounding each "bump" or transition from a VVO "on" state to a VVO "off" state. In some VVO systems, the transition may complete rapidly enough that data from, say, approximately 5 minutes before the bump to, say, approximately 10 minutes after the bump may be sufficient. Because of the shorter time period involved under the methods of the present invention, there is no need or requirement to temperature correct the data from the bump test.

In one embodiment, the method of evaluating an optimization system, such as a VVO system, includes transitioning the system from on state to an off state and collecting data at time intervals for a time period before and after the system is transitioned from the on state to the off state. The evaluation may be carried out over multiple days or multiple weeks.

The transitioning may be performed once a day or at least twice a day and completed in a matter of seconds, minutes, or hours. In one particular embodiment, the transitioning is completed in approximately 5 to 15 minutes, but is not meant to be limiting.

The data may be collected at various time intervals. In one particular embodiment, the data is collected in 10 to 60 second time intervals. A filter may be applied to smooth the data.

In one particular embodiment, an on→off transition is performed by switching off the VVO system and allowing voltage control setpoints to return to their default levels, resulting in a sudden increase in voltage throughout a distribution feeder. The voltage at a substation bus stabilizes at the higher level within two minutes of the initiation of the transition. An analysis of voltage measurements at certain end-of-line (EOL) points showed that the transition to the higher voltage level was complete in a matter of a few minutes throughout the length of each feeder.

Experimental Section

The following examples from a study serve to illustrate embodiments and aspects of the present invention and are not meant to be construed as limiting the scope thereof.

EXAMPLE

Energy Reduction Evaluated with Bump Test Method

This Section describes the bump test method of the present invention to evaluate end-use energy reductions. The data set and the bump test analysis methodology are described. Next, the overall end-use energy reduction in the VVO system, as computed by the bump test method, is compared to the energy reduction calculated from the conventional or prior day-on/day-off evaluation.

Data Collected

The data required to conduct a bump test was collected from Nov. 4, 2013 through Nov. 25, 2013. To conduct the analysis, the electric utility provided time-series Supervisory Control And Data Acquisition (SCADA) data recorded at 10-second intervals for the following quantities, all individual phase measurements:

Active power (MW) and reactive power (MVAR) demand of the feeder

Voltage magnitude at the substation bus

The active and reactive power flow through and voltage at both sides of any mid-line regulators The voltage at every capacitor and the active and reactive power flow through the line at the connection point The active and reactive power flow through each switch and the voltage at both sides The voltage at End-of-Line (EOL) points The bump test evaluation requires only data from a brief time period surrounding each bump. For this system, the transition completed rapidly enough that data from 5 minutes before the bump to 10 minutes after the bump was sufficient, although other time ranges may be used. Because of the brief time period involved there is no need to temperature correct data from a bump test.

Bump Test Methodology

The following sections describe the bump test method used in this study to calculate the change in energy consumption due to the operation of the VVO system. Data quality and data quantity are discussed.

Carrying Out and Analyzing a Bump Test at Single Point in Time

An on→off transition is performed by switching off the VVO system and allowing voltage control setpoints to return to their default levels, resulting in a sudden increase in voltage throughout the feeder. The voltage at the substation bus stabilizes at the higher level within two minutes of the initiation of the transition. An analysis of voltage measurements at EOL points showed that the transition to the higher voltage level was complete in less than five minutes throughout the length of each feeder. This rapid increase in voltage results in a step change increase in energy.

FIG. 1 shows an example of an on→off transition on feeder OW3 of the VVO system. The voltage at the substation bus (scaled to a 120V base) can be seen as labeled on the right-hand axis, and the active power demand can be seen as labeled on the left-hand axis. The multi-volt rise, due to regulator tap operations, at the transition can be clearly seen, and the responding increase in active power demand is also clearly evident, for this particular transition. The change in energy consumption that accompanies the change in voltage forms the basis for the bump test evaluation methodology.

Figure 2:
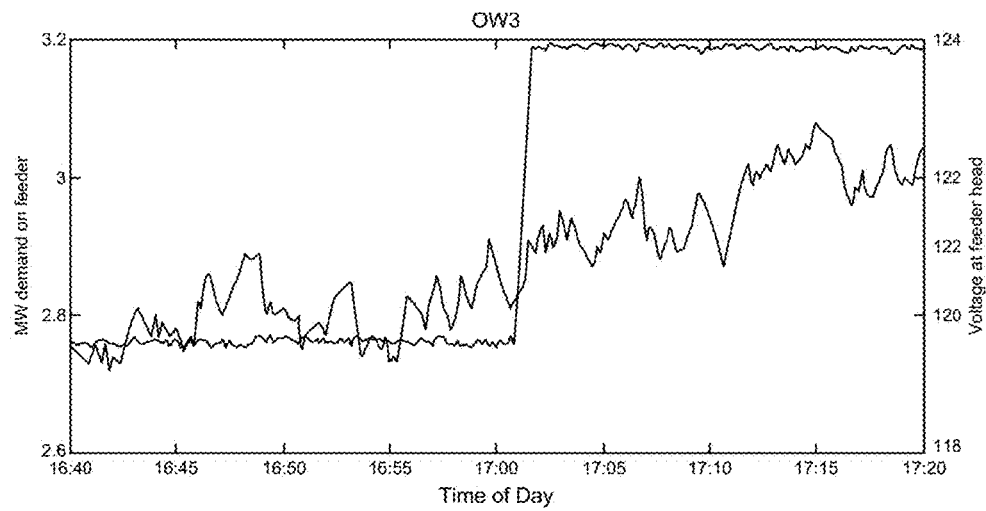
FIG. 2 shows power demand and voltage for a single on→off transition on a feeder with a VVO system, an example when the change in power demand in a single transition is not larger than the ambient level of noise.

Not all transitions are as easy to characterize as the transition shown in FIG. 1. FIG. 2 shows a transition on the same feeder, at the same time of day, with the voltage and active power demand. For this particular transition, the transition is not clear and easy to distinguish from the minute-to-minute random variations of demand. On some days on some feeders, a step change in active power demand was clearly evident at the transition point, but for others, it could not be reliably calculated.

Figure 3:
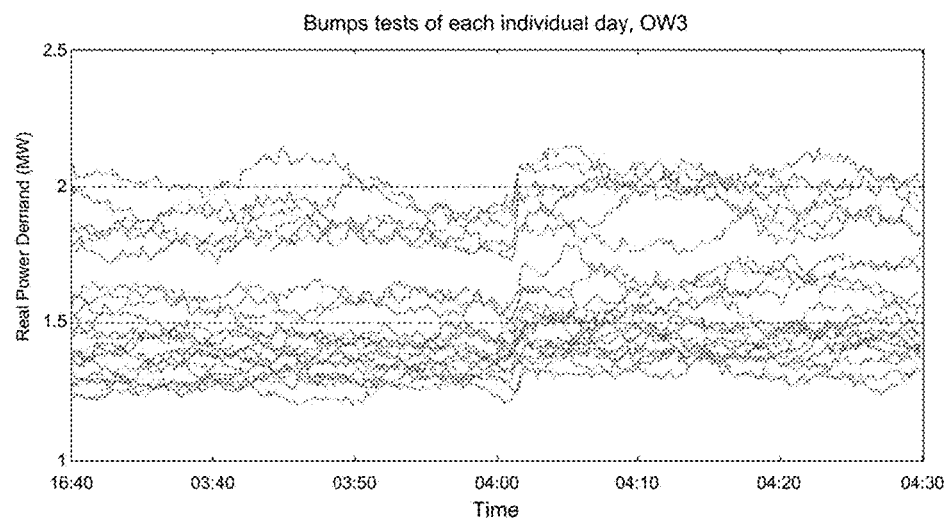
FIG. 3 shows power demand through on→off transition for 22 days on a feeder with a VVO system.

FIG. 3 shows the active power demand for individual days, as measured at the head of feeder OW3 through the 4:00 am transition time. There are 22 transitions at this time. The data is shown for an hour centered about the on→off transition. For each individual day of data, the response due to the VVO system transition is not significantly larger than the random variations in active power demand, and an energy-reduction estimate cannot be reliably calculated directly from a single day.

Figure 4:
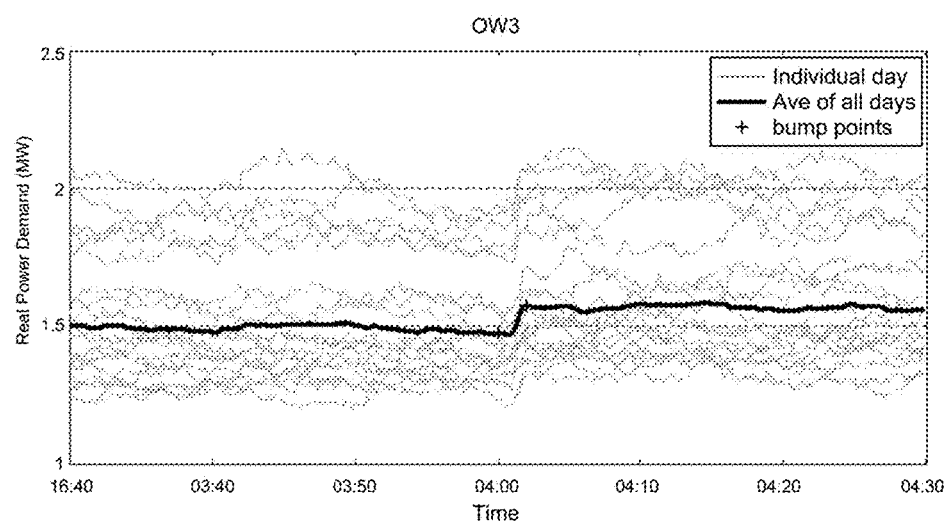
FIG. 4 shows average power demand through on→off transition and bump points on a feeder with a VVO system.

In order to distinguish the step change at the transition from the random variation in demand, the active power demand at a given time is averaged over all 22 days in the study period and filtered. Only transitions that occurred at the same time of day were combined into a single calculation; transitions that occurred at different times of day were not averaged together. The result is the thicker, black line in FIG. 4. For each of the feeders studied, the average of 22 days shows a clear step change at the transition time, and a change in power demand due to the transition can be clearly identified. The active power demand at 4:00 is marked with an asterisk, and the active power demand post-transition is marked as well with an asterisk. The active power demand post-transition was identified as the demand at the first local maximum after the transition time. The difference between the two is the average change in active power demand due to the operation of the VVO system at the transition time.

For this study, all data was recorded at 10-second intervals. To further improve the signal-to-noise ratio, a Savitzky-Golay filter was applied to the active power demand. A Savitzky-Golay filter is a peak-preserving filter, a generalized moving average with filter coefficients determined by an unweighted linear least-squares regression and a polynomial model. A polynomial of order 2 and a span of the moving average to 7 data points were used. The span was chosen because a width of 30 seconds reduced random variations without depressing the peak of the bump. The order of the polynomial was chosen because it smoothly interpolated through the small number of data points in each sample set. The smoothed active power demand is shown in the thicker, black line. Note that since the bump test response is complete in less than five minutes, this filtering step would not be possible without high time resolution data, as it requires that multiple timesteps of data are recorded through the brief transition period.

Effect of Study Timespan on Bump Test Results

This study was carried out over 22 days and all of the data combined into a single result. It is of interest to determine if the full 22 days were necessary, or if similar results could be obtained from a smaller set of days. While the error on the estimate from the collective 22 days is difficult to estimate, the error on the estimate from smaller subsets of days can be calculated, and then the results extrapolated for a 22-day sample.

Figure 5:
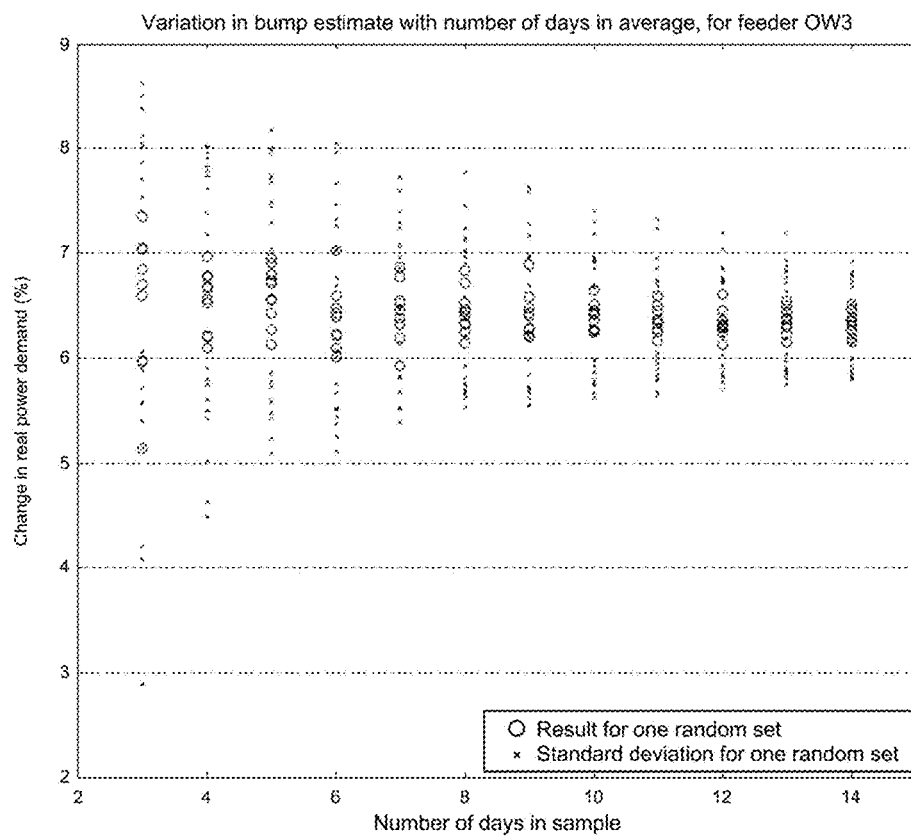
FIG. 5 shows variation in bump estimate with number of days averaged on a feeder with a VVO system.

Random subsets of the 22 days were taken, for sample sizes ranging from 3 days to 15 days. The energy reduction calculation was carried out on each randomly sampled subset. This was repeated for 10 different random samples of a given size, and a standard deviation is calculated from the set of 10. That entire process was then carried out 10 times. The standard deviation of the energy reduction calculation can be computed for each different set of random samples. In addition, since the process is repeated, the standard deviation of that standard deviation can be calculated across the entire set of samples. Statistics can be developed for how results of the bump test calculation and the standard deviation of the bump test calculation trend as a result of the number of days considered in the calculation. FIG. 5 shows an example of a set of calculations carried out for sample sizes ranging from 3 days to 15 days, for feeder OW3. The round circles are the average percentage change in active power demand from the calculation, for each set of randomly sampled subsets. The "x" marks indicate the extent of the standard deviation of each subset. Results are shown for the morning bump of feeder OW3; results were similar for other feeders.

Figure 6:
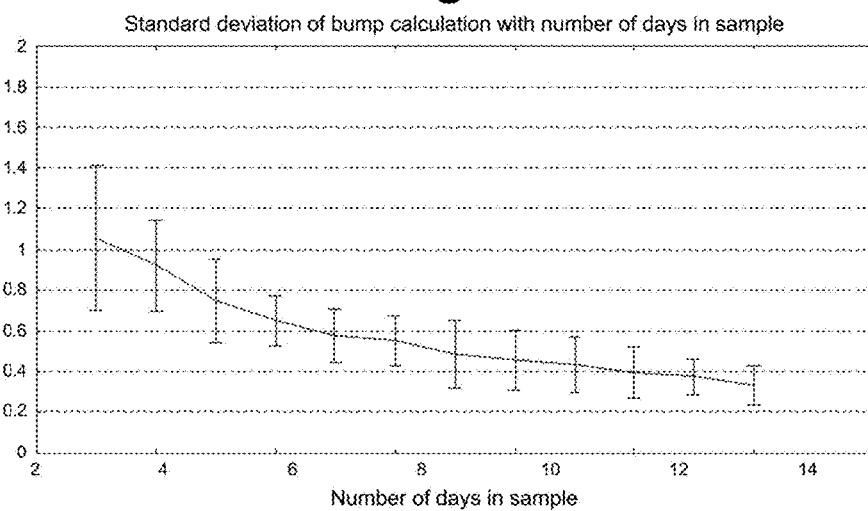
FIG. 6 shows variation in standard deviation with number of days averaged on a feeder with a VVO system.

The average standard deviation of the calculated result is plotted as a function of the number of days in the subset in FIG. 6. It can be seen that the standard deviation of the percentage change in active power drops significantly as the number of days in the subset increases from 3 days to 7 days, and then continues to decline slowly as the number of days in the subset increases further. The average standard deviation shrinks to 0.5% with 11 days in the sample subset. Results are shown for the morning bump of feeder OW3; results were similar for other feeders. In general, a bump test span of two weeks seems to be sufficient to bring the standard deviation of the calculated percentage active power reduction below 0.5%.

This section has described how the number of days in the sample affects the error on the result for a single feeder. The next section describes how that changes when load is aggregated from multiple feeders.

Effect of Load Aggregation on Bump Test Results

As seen in FIG. 1 and FIG. 2, the random variation in power demand from one timestep to the next can be a significant fraction of the size of the step change in demand due to the transition of the VVO state. One way to minimize the effect of that random variation on the result is to average across many days, as described in the previous section. A different way is to aggregate additional load, so that the random variations are a smaller fraction of the total load and the total step size.

Instead of looking at an individual feeder, the total demand on a substation bus, or the total demand of the entire system under study, can be aggregated and the same calculation carried out as described in the previous section. If that aggregation is performed, the number of days required to reach the same level of uncertainty is reduced.

Figure 7:
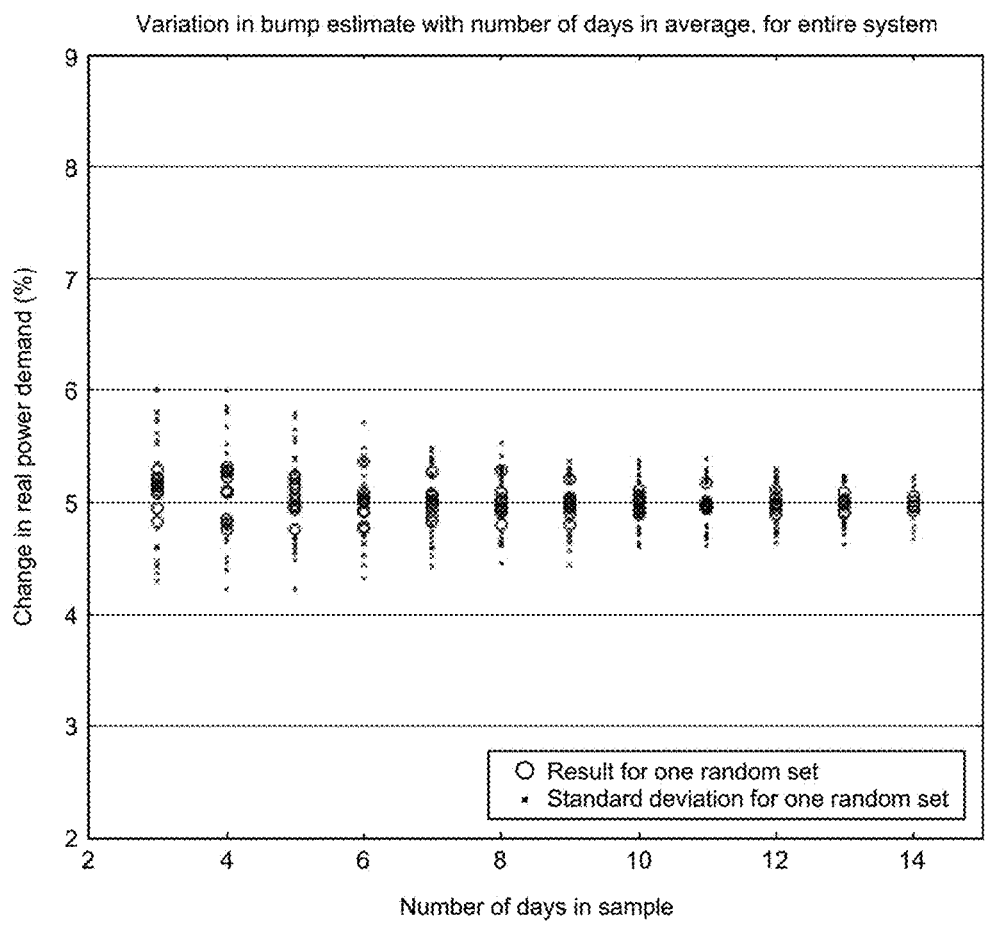
FIG. 7 shows variation in bump estimate with number of days averaged for the aggregated load of 13 feeders with a VVO system.

FIG. 7 shows the same calculation as shown in FIG. 5, but carried out on the aggregated demand of the entire system under study, the sum of demand from all 13 feeders. Note that the limits on the y axis are the same on the two figures. It can be seen that the variation in the result calculated from randomly chosen subsets of days is smaller for the bus total than the individual feeder, and declines more quickly as the number of days increases.

Figure 8:
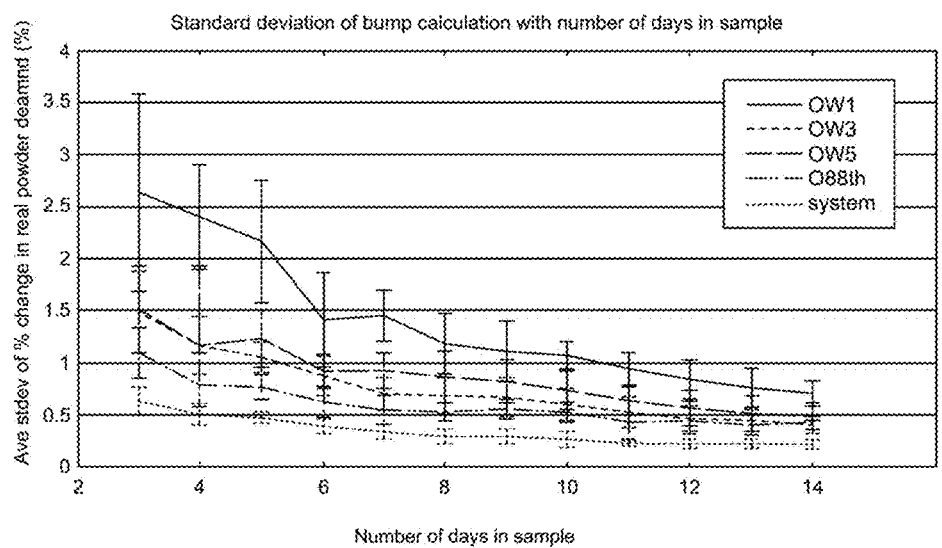
FIG. 8 shows variation in standard deviation of bump calculations with number of days averaged for individual feeders, an aggregate of three feeders, and an aggregate of 13 feeders, with a VVO system.

The effect of the load aggregation can be seen by comparing the average of the standard deviation of the calculation from the randomly sampled subsets—the same calculation shown in FIG. 6—for individual feeders, for the aggregate demand on a substation, and for the aggregate demand on the system as a whole. This is shown in FIG. 8. FIG. 8 shows the calculations for OW1, OW3 and OW5, which are the individual feeders of the 88$^{th}$ substation, along with the aggregate of all three—the demand on the 88$^{th}$ substation as a whole. Also shown in FIG. 8 is the aggregate of the entire system, the sum of all 13 feeders on the three substations. The effect of further load aggregation can be clearly seen. This suggests that for an estimate of a target uncertainty, the number of days that is required to average decreases as the load aggregation increases. If the goal is, for example, to achieve an estimate of the effectiveness of the VVO system that is accurate to within ±0.5%, the number of days that is required to average is two weeks or more for an estimate of an individual feeder's performance, roughly a week for a substation, and perhaps as little as four days for a set of substations.

Previous sections have described how to calculate active power reduction at a single point in time and how error can be estimated. The next section describes how to extrapolate from those results to an estimate of the total energy reduction over the course of a day.

Extrapolating Bump Tests to Energy Reduction Estimate

Figure 9:
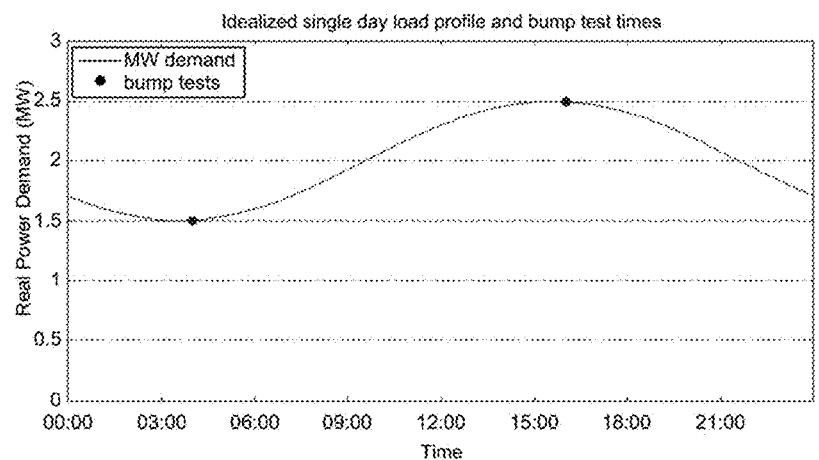
FIG. 9 shows an idealized daily load shape, with the time of day of bump tests marked as shown at approximately 4:00 and 17:00.

The step change in energy as a response to the step change in voltage can be used to calculate the instantaneous end-use energy reduction at the point in time of the on→off transition. However, the desired value is the end-use energy reduction, for an entire day, and over an entire year. Since load varies over the course of a day, as does the effectiveness of the VVO system, the bump test may be carried out multiple times per day and the results extrapolated into an estimate for the day. Due to variation over the course of the day, the calculation may increase in accuracy if more times of day were tested. The desire to increase accuracy should be balanced against both the need to shield customers from excessive changes in voltage and to minimize the impact on tap changing and switching equipment. While the voltage remains within the acceptable bands specified by ANSI Standard C84.1 both before and after the transition, repeated, significant change in voltage may cause adverse impacts on some customer applications. During this evaluation, these conflicting needs were considered and it was decided that, for this example study, bump tests would be carried out twice per day, once near system minimum load and once again near system peak load, as a way to more efficiently capture maximally different load compositions. It should be noted, of course, that the bump test may be carried out more than twice per day or less than twice per day. FIG. 9 shows an idealized picture of a daily load shape. The system minimum and maximum are marked on the curve. For the system in the test footprint, those times (shown on the curve as marks) were 4:00 and 17:00.

Figure 10:
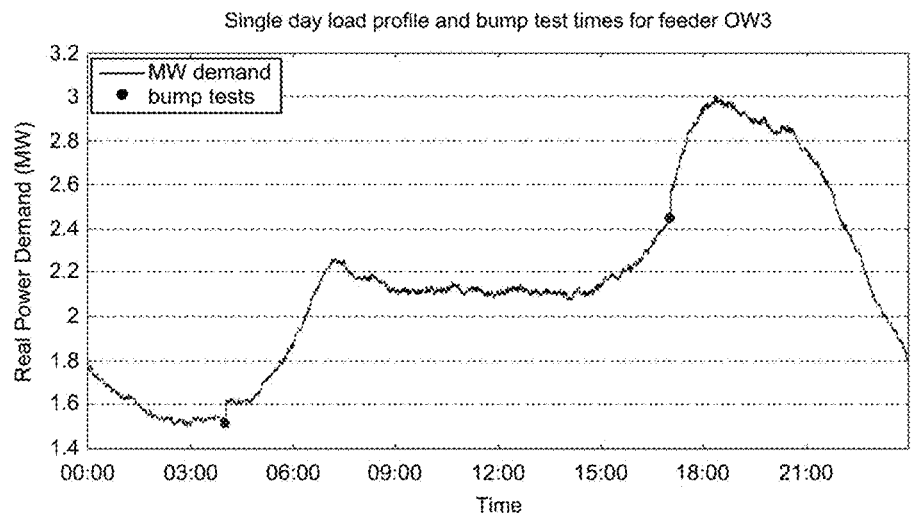
FIG. 10 shows an actual average load shape for a feeder with a VVO system, with time of day of bump tests marked as shown at approximately 4:00 and 17:00.

FIG. 10 shows an actual average load shape, from feeder OW3. It can be seen that for this feeder, the chosen times did not capture the time of maximum load. Because the time of day of peak load varied between feeders, the maximum load was not effectively captured by the 17:00 bump for many of the feeders in this study. For this particular feeder, the load shape suggests that a more accurate estimate of overall energy savings might be achieved by performing more bumps over the course of the day, such as three bumps: at middle-of-the night minimum load, at the middle of the day intermediate loading levels, and in the early evening at the peak load time period.

Figure 11:
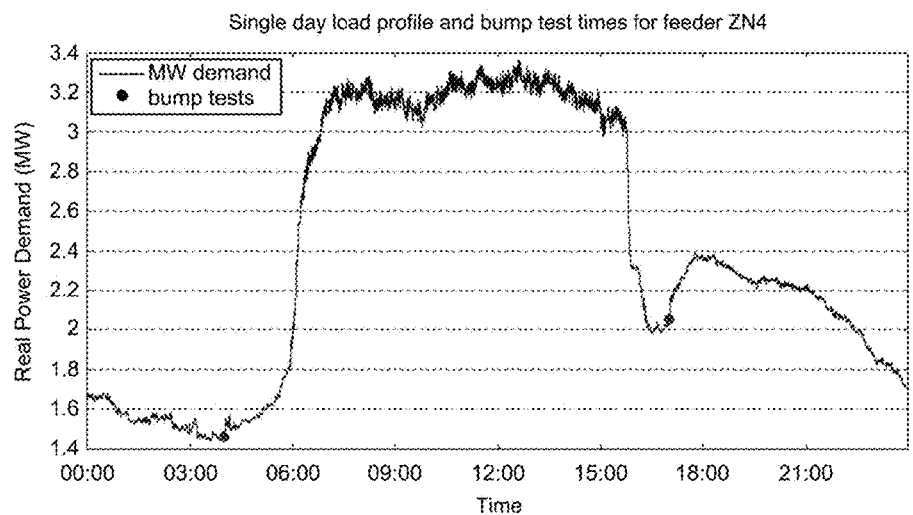
FIG. 11 shows the average daily load shape for a feeder with a VVO system, with time of day of bump tests marked as shown at approximately 4:00 and 17:00.

For one feeder in particular, ZN4, the selected times clearly did not do an adequate job of capturing the effect of the VVO system over the course of the day. The average load over the course of the day is shown in FIG. 11. Feeder ZN4 hosts an industrial load of ~800 kW, a rock crusher, which turns on each weekday at 6:00 and turns off at 16:00. Results from the conventional day-on/day-off study indicate that the portion of the feeder where the rock crusher is connected shows almost no change in energy consumption at all due to the VVO system. Given those results and the time of day of the bump tests, it is expected that the estimate of energy reduction from the bump test would over-estimate the energy reduction as compared to the day-on/day-off calculation. As will be seen and described later below, this is consistent with what is observed.

Figure 12A:
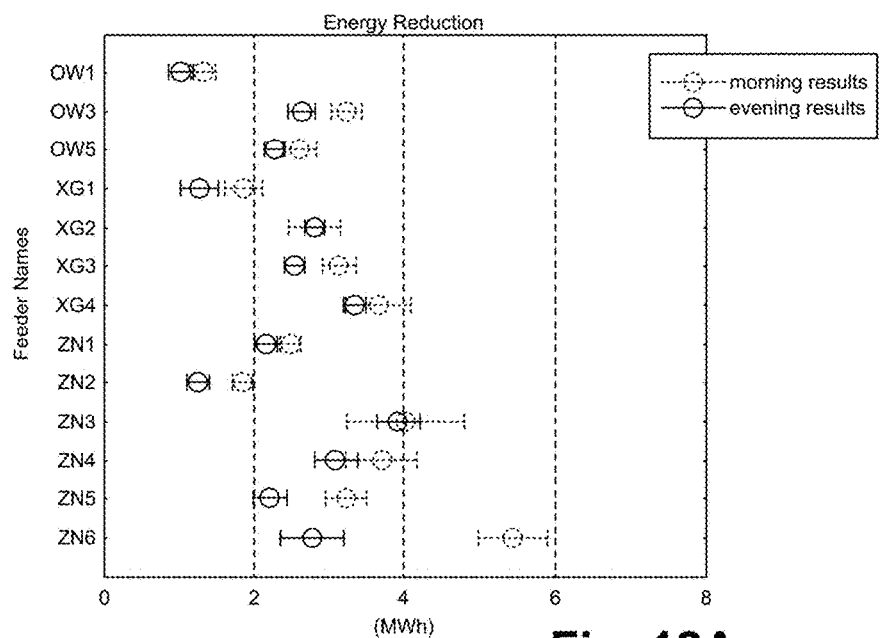
FIG. 12A shows the estimated energy reduction in absolute energy due to the VVO system using a bump test calculation considering a morning bump only and an evening bump only.
Figure 12B:
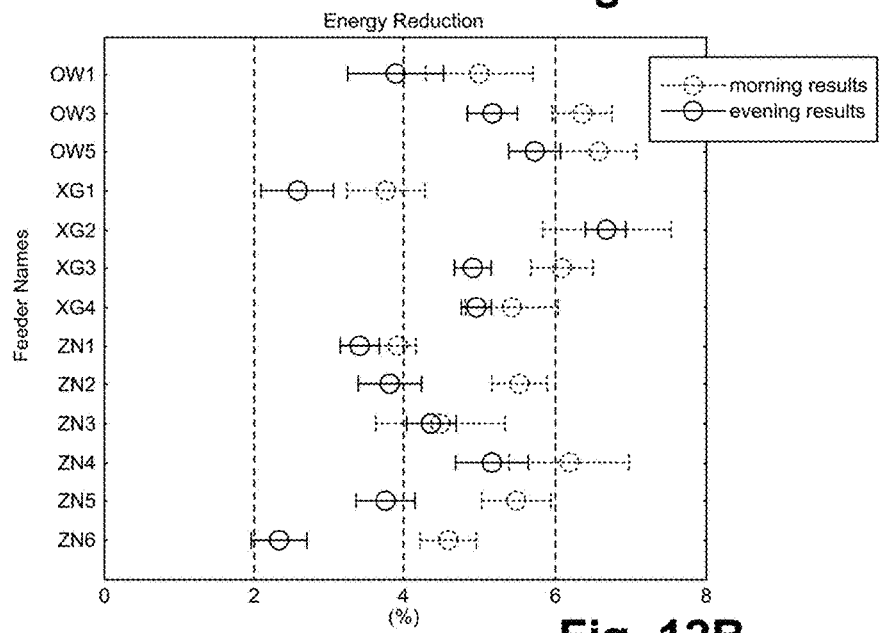
FIG. 12B shows the estimated energy reduction by percentage change due to the VVO system using a bump test calculation considering a morning bump only and an evening bump only.

The extent to which variation due to differences in load composition affects the calculation of overall energy savings can be inferred by comparing energy reduction calculated from the morning bumps alone (bump tests carried out at 4:00) to the energy reduction calculated from the evening bumps alone (bump tests carried out at 17:00). FIGS. 12A and 12B show the estimated energy reduction due to the VVO system, with FIG. 12A showing the estimated energy reduction in absolute energy and FIG. 12B showing the estimated energy reduction in percentage change. The results from considering the morning bumps only and extrapolating over the entire day are compared next to the results when considering evening bumps only. The extrapolation was carried out by calculating the instantaneous reduction in active power demand at the time the bump test was carried out, and then scaling that instantaneous reduction by the ratio of the average active power demand over the course of the day to the active power demand at the time of the bump. For example, to extrapolate the morning bump value to an estimate of the total energy reduction, $$\Delta E_{total} = \Delta E_{am} \cdot \frac{\overline{MW}}{MW_{am}} \quad (2.1)$$

where:
$\Delta E_{total}$: total daily reduction in energy consumption due to operation of VVO system
$\Delta E_{am}$: reduction in energy consumption as calculated from the morning bump only
$\overline{MW}$: average active power demand over the entire day
$MW_{am}$: active power demand at the time of the morning transition From FIGS. 12A and 12B it can be seen that for most feeders there is significant difference between the two estimates, and in roughly half of cases, error bars do not overlap. This shows that if only a single bump test is used, the estimated results may vary by as much as 2%, depending on which time of day is chosen. Before carrying out an evaluation of the energy reduction using bump tests, it is important to consider the daily load profile of the system under study. More accurate results may be obtained if the time of day of the bump tests is distributed so as to capture key features in the load profile, and then the individual bump tests are scaled appropriately in the full-day result. Some application of engineering judgment is required.

For this study, with two bump tests per day, the results from the morning and evening bumps were combined in a weighted average in order to estimate the total energy reduction due to the VVO system over the course of the whole day. The calculated change in active power demand at the time of each bump was weighted by relative load at the time of the transition, in order to more heavily weight the results from times with more load, since it will be a larger fraction of the day's total load.

$$\Delta E_{total} = \Delta E_{am} \cdot \frac{MW_{am}}{MW_{am} + MW_{pm}} + \Delta E_{pm} \cdot \frac{MW_{pm}}{MW_{am} + MW_{pm}} \quad (2.2)$$

where:
$\Delta E_{total}$: total daily reduction in energy consumption due to operation of VVO system
$\Delta E_{am}$: reduction in energy consumption as calculated from the morning bump only
$\Delta E_{pm}$: reduction in energy consumption as calculated from the evening bump only
$MW_{am}$: active power demand at the time of the morning transition
$MW_{pm}$: active power demand at the time of the evening transition The results of analysis using equation (2.2) are shown next and compared to the results of the conventional day-on/day-off evaluation.

Change in End-Use Energy Consumption as Computed by Bump Test

Figure 13:
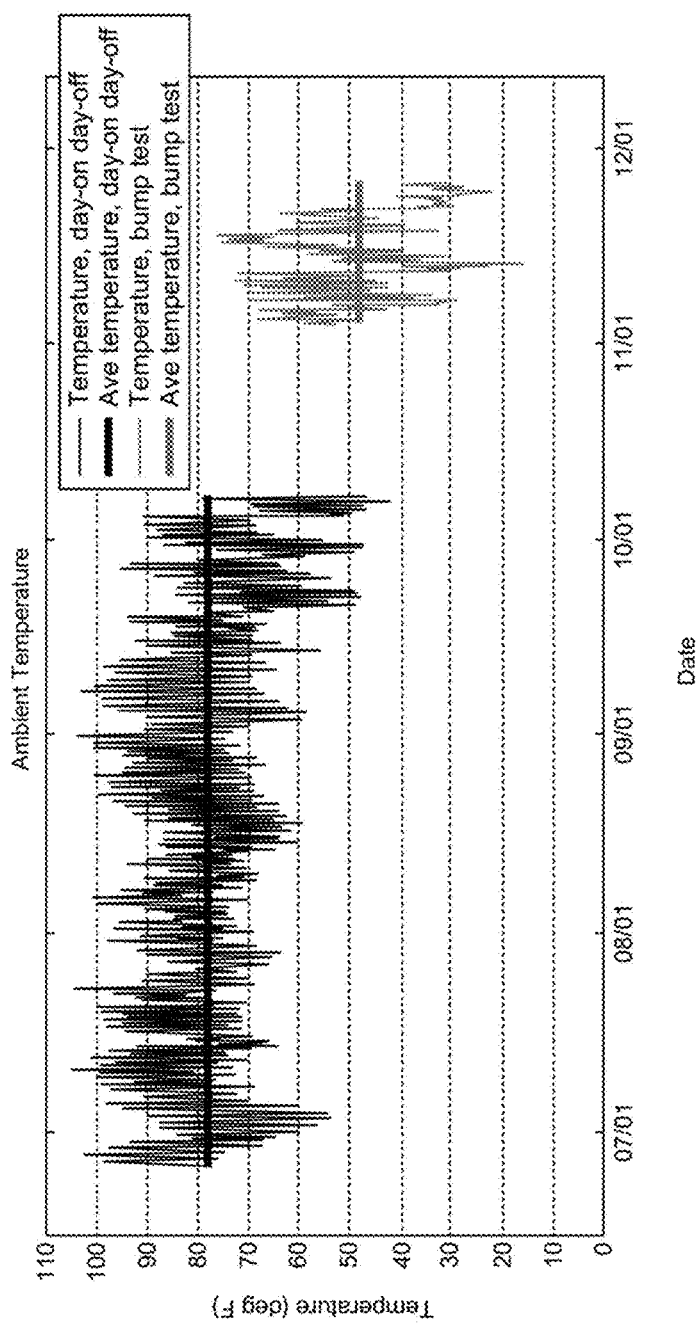
FIG. 13 shows ambient temperature during the evaluation period using conventional day-on/day-off method and the evaluation period using the bump test method of the present invention.

The results of the bump test were compared against the results of the conventional day-on/day-off evaluation of the energy reduction. It is important to recognize, however, the difference in season between the time the day-on/day-off evaluation was carried out and when the bump test was carried out. As a result, the performance of the VVO system was different between day-on/day-off evaluation and the bump test evaluation. Because external air temperature has such as a strong impact on active power consumption, the differences in temperature for the two time periods were examined. FIG. 13 shows time series data of ambient temperature recorded during the two studies, with the average temperature observed during each study shown as a thicker line. The day-on/day-off evaluation was carried out over 90 days between late June and early October, 2013. Daytime high temperatures routinely exceeded 90° F. and the lowest temperature observed was above 40° F. It is highly likely that air conditioning was a significant fraction of the load during much of this evaluation. In contrast, the bump test was carried out over three weeks in mid-November, 2013, when temperatures were significantly cooler; the coldest temperature reached during the bump test period was less than 20° F. and the daytime highs were typically 40-70° F. It is not likely that air conditioning was a significant portion of the load during this evaluation. The difference in average temperature between the two evaluation periods was approximately 30° F.

Figure 14:
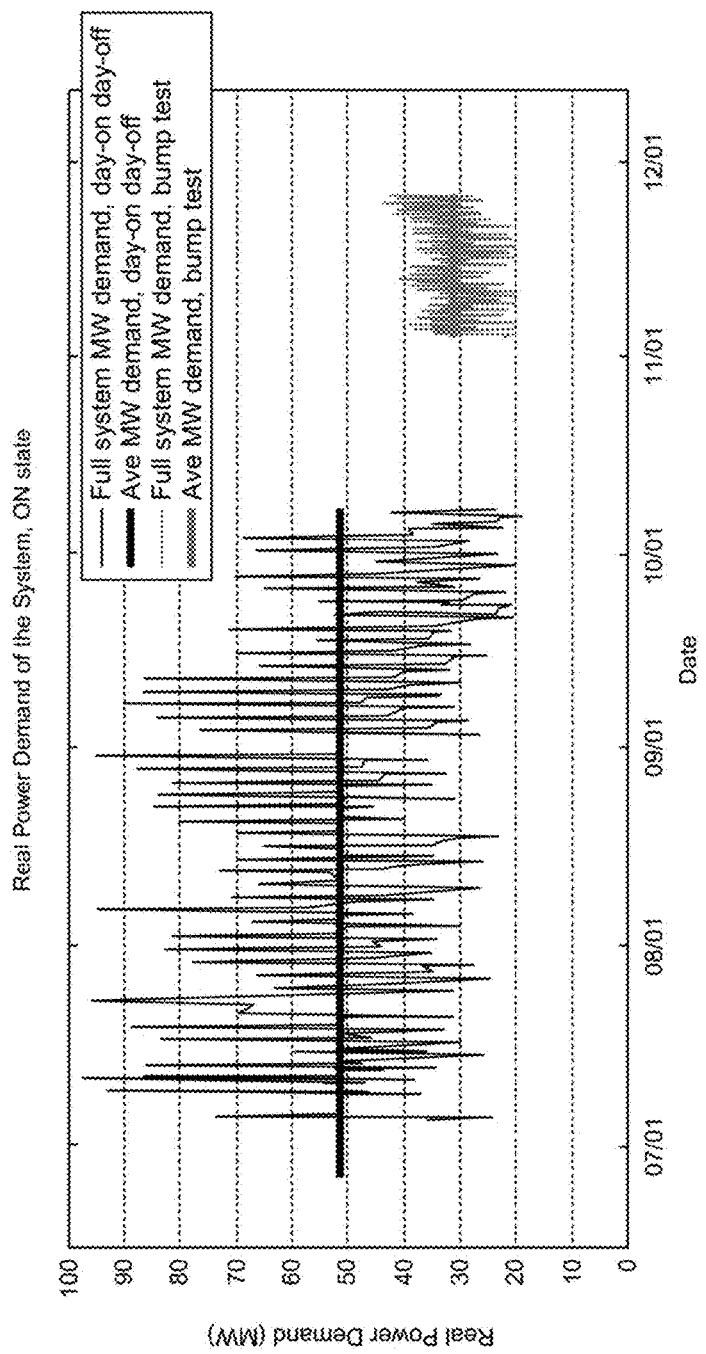
FIG. 14 shows total load during the evaluation period using the conventional day-on/day-off method and the evaluation period using the bump test method of the present invention.

Due to the difference in ambient temperature, the load level and load composition were not the same during the two studies. FIG. 14 shows the combined active power demand of the 13 feeders in the system, with average load level over the course of the two studies shown as a thicker line. Over the course of the day-on/day-off evaluation, the average load on the entire system under study was 51.3 MW. The average load on the entire system under study over the course of the bump test evaluation was only 31.3 MW.

Figure 15A:
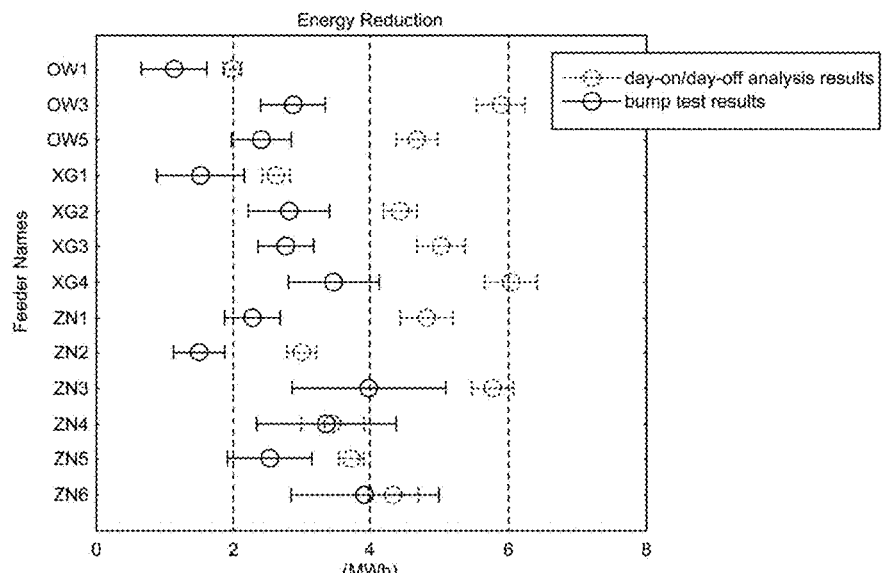
FIG. 15A shows the results of a bump test method of the present invention compared to the conventional day-on/day-off method. The change in energy consumption in absolute energy is calculated for thirteen distribution feeders with a VVO system.
Figure 15B:
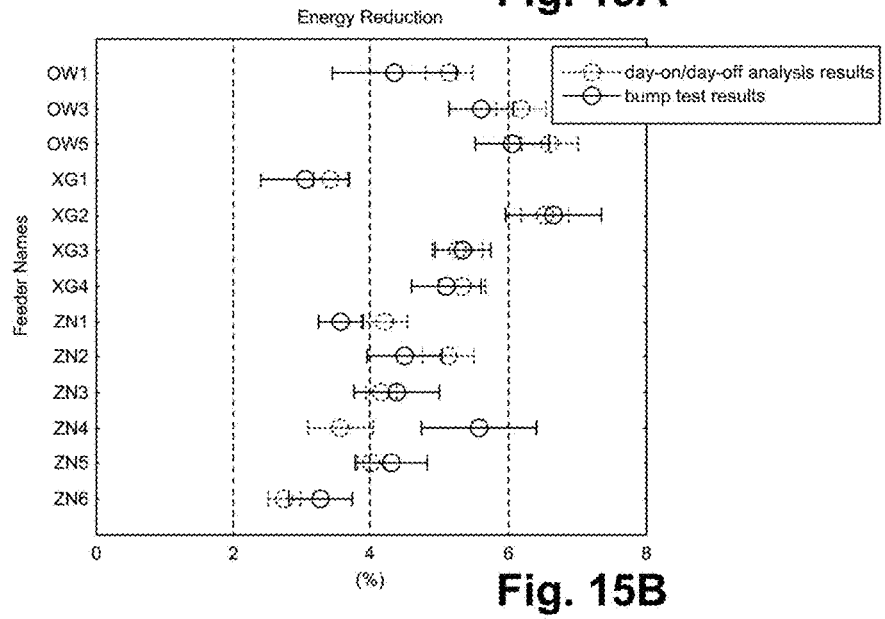
FIG. 15B shows the results of a bump test method of the present invention compared to the conventional day-on/day-off method. The change in energy consumption in percent change is calculated for thirteen distribution feeders with a VVO system.

The bump test methodology as described above was applied to the 22 days of data. FIGS. 15A and 15B show the change in energy consumption for the thirteen distribution feeders, in both absolute energy values, FIG. 15A, and by percent, FIG. 15B. The circles indicate the change in energy consumption and the horizontal bars the standard error on the calculation. The energy reduction is calculated for all three phases in aggregate. The results from the day-on/day-off calculation are shown in comparison to the results from the bump test calculation.

Due to the significant difference in load level, it is expected that the average energy reduction on each feeder will not match between the two studies. Calculations of percentage energy reduction, while they are likely to be affected by difference in load composition, are more likely to be comparable. It can be seen in FIGS. 15A and 15B that the energy reductions in MWh, FIG. 15A, do not agree well between the two studies, as expected; results from almost all feeders do not have overlapping error bars. It can also be seen that the percentage energy reductions, FIG. 15B, do agree between the two methods, with the exception of feeder ZN4. As previously discussed, this is expected because the bump test times of day do not overlap with the time when a significant industrial load, which has little observed energy reduction response, is active.

The analysis indicated that the variation in the result decreased as load as aggregated across multiple feeders. The load was aggregated for each of the five substation buses in the three substations in the area under study and the bump test calculation was carried out. In the same format as shown in FIGS. 15A and 15B, FIGS. 16A and 16B compare the results of the day-on/day-off calculation to the results of the bump test calculation, for the aggregate load of each substation bus. Substation bus labels used by the utility were adopted:

OWBUS1 includes feeders OW1, OW3, and O5
XGBUS1 includes feeders XG1 and XG3
XGBUS2 includes feeders XG2 and XG4
ZNBUSA includes feeders ZN1, ZN3, and ZN5
ZNBUSB includes feeders ZN2, ZN4, and ZN6

Figure 16A:
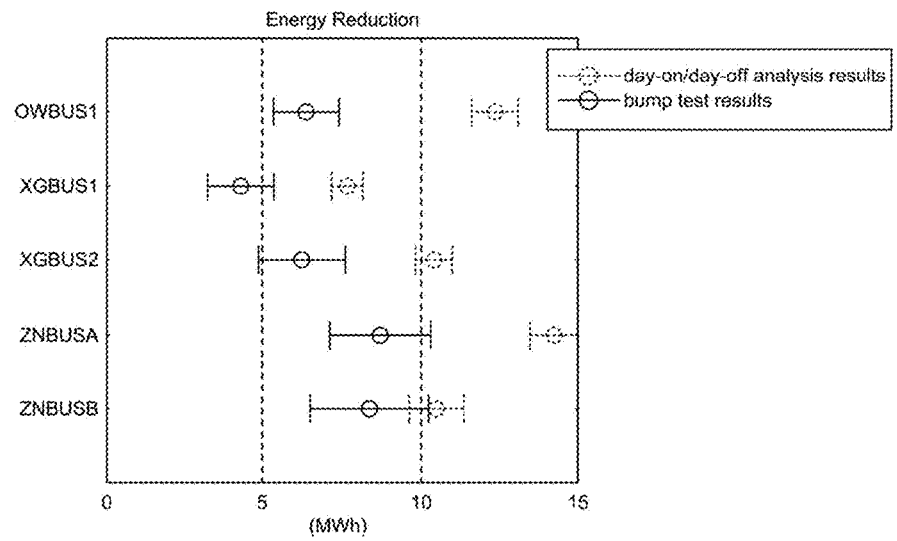
FIG. 16A compares the average energy reduction results in absolute energy of the conventional day-on/day-off calculation to the bump test method of the present invention, for the aggregate load of each substation bus with a VVO system.
Figure 16B:
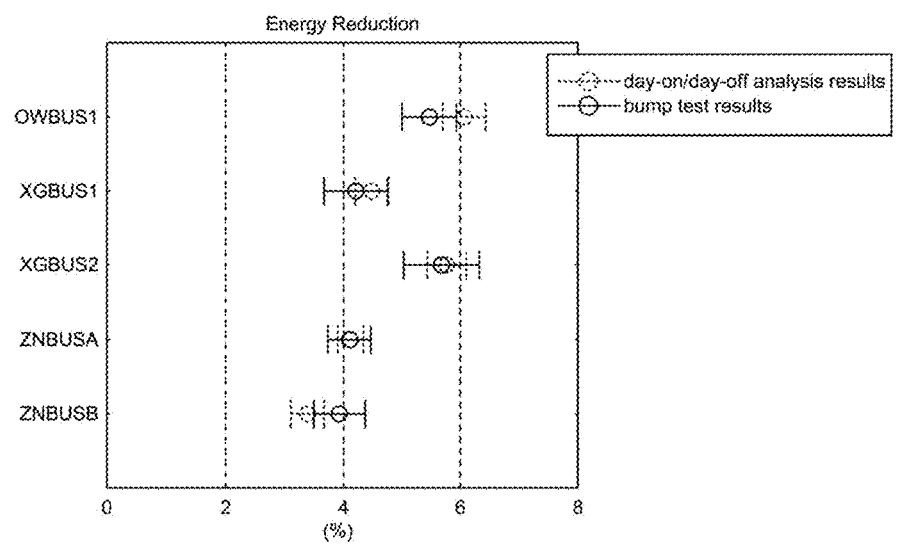
FIG. 16B compares the average energy reduction results in percent change of the conventional day-on/day-off calculation to the bump test method of the present invention, for the aggregate load of each substation bus with a VVO system.

Similar to the feeder-level results shown in FIGS. 15A and 15B, the average energy reduction results in FIGS. 16A and 16B do not agree between the two analyses. Also similar to results shown in FIG. 15B, the percentage energy reductions of FIG. 16B do match within error bars for the two results. It can be seen that the calculated percentage energy reduction results from the two methods match slightly more closely when the load is aggregated across multiple feeders, and that the error bars on both calculations are reduced. This indicates that more accurate results for energy reduction can be achieved by aggregating larger collections of load before carrying out an analysis.

For the VVO system used in testing the performance of the method, the bump test, carried out using data from a three week evaluation period, effectively reproduces the percentage energy reduction results from the conventional 90-day day-on/day-off evaluation. Since this analysis has shown that the bump test can effectively reproduce the percentage energy reduction, an accurate energy reduction in MWh could be computed by multiplying the percentage energy reduction by the load level.

Conclusions from Bump Test Evaluation

The methods of the present invention were developed to include bump tests to evaluate the change in end-use energy consumption due to the operation of a VVO system. The evaluation of the percentage energy reduction due to the operation of the VVO system, using the bump test method described in the study, agree within error bars to the results of the lengthier and more complex, conventional day-on/day-off evaluation.

While a number of embodiments of the present invention have been shown and described, it will be apparent to those skilled in the art that many changes and modifications may be made without departing from the invention in its broader aspects. The appended claims, therefore, are intended to cover all such changes and modifications as they fall within the true spirit and scope of the invention.

We claim:

1. A method of evaluating a reduction in energy for a period due to a VOLT/VAR optimization (VVO) system that is disposed in an electrical grid, the VVO system using a coordination of tap changers and voltage regulators at a feeder level to reduce energy consumption, the method comprising:
    causing a transition of the VVO system from an on state to an off state at least twice in a period; for each of the transitions, performing operations comprising:
        receiving electrical grid characterization data corresponding to time periods before and after a respective transition of the VVO system;
        determining a change in active power demand for the respective transition based on the electrical grid characterization data; and
        calculating a reduction in energy consumption for the respective transition based on the change in active power demand for the respective transition; calculating the reduction in energy for the period based on the reduction in energy consumption for each of the transitions;
    determining a performance of the VVO system in reducing energy consumption based on the reduction in energy for the period, wherein determining the performance of the VVO system in reducing energy consumption based on the reduction in energy for the period is computed by combining, in a weighted average, the results from a first transition of the transitions weighted by a first relative load at the time of the first transition and the results from a second transition of the transitions weighted by a second relative load at the time of the second transition; and
    determining whether to continue using the VVO system on the electrical grid based on the determined performance.

2. The method of claim 1, wherein the electrical grid characterization data comprises active power (MW) and reactive power (MVAR) demand of a feeder, voltage magnitude at a substation bus, active and reactive power flow through and voltage at both sides of any mid-line regulators, voltage at a capacitor, active and reactive power flow through a line at a connection point, active and reactive power flow through a switch and voltage at both sides, or voltage at end-of-line (EOL) points.

3. The method of claim 1, wherein the electrical grid characterization data is collected at ten to sixty second time intervals.

4. The method of claim 1, further comprising, for each of the transitions, applying a filter to smooth the electrical grid characterization data.

5. The method of claim 1, wherein the VVO system includes capacitors that are used to flatten a voltage and correct a power factor.

6. The method of claim 1, further comprising repeating the causing, the operations, the calculating, and the determining the performance for a plurality of periods.

7. The method of claim 6, wherein the reductions in energy for the respective periods are aggregated to determine a total reduction in energy for the plurality of periods.

8. The method of claim 1, wherein the method further comprises, for each of the transitions, responsive to the VVO system being off for a predetermined period of time, transition the VVO system from the off state to the on state.

9. The method of claim 8, wherein the predetermined period of time is between five and fifteen minutes.

10. The method of claim 1, wherein the VVO system includes a Conservation Voltage Reduction (CVR) system.

11. The method of claim 10, wherein the CVR system is used to control the tap changers and voltage regulators.

12. A method of evaluating a reduction in energy for a period due to a Volt/VAR optimization (VVO) system that is disposed in an electrical grid, the VVO system using a coordination of tap changers and voltage regulators at a feeder level to reduce energy consumption and a coordination of capacitors to flatten voltage and correct a power factor, the method comprising:

causing a transition of the VVO system from an on state to an off state at least twice in the period, the transitions based on a particular type of electrical load being active;

for each of the transitions, perform operations comprising: receiving electrical grid characterization data corresponding to time periods before and after a respective transition of the VVO system;

determining a change in active power demand for the respective transition based on the electrical grid characterization data; and calculating a reduction in energy consumption for the respective transition based on the change in active power demand for the respective transition; calculating the reduction in energy for the period based on the reduction in energy consumption for each of the transitions;

determining a performance of the VVO system in reducing energy consumption based on the reduction in energy for the period, wherein determining the performance of the VVO system in reducing energy consumption based on the reduction in energy for the period is computed by combining, in a weighted average, the results from a first transition of the transitions weighted by a first relative load at the time of the first transition and the results from a second transition of the transitions weighted by a second relative load at the time of the second transition; and determining whether to continue using the VVO system on the electrical grid based on the determined performance.

13. The method of claim 12, wherein the electrical grid characterization data comprises active power (MW) and reactive power (MVAR) demand of a feeder, voltage magnitude at a substation bus, active and reactive power flow through and voltage at both sides of any mid-line regulators, voltage at a capacitor, active and reactive power flow through a line at a connection point, active and reactive power flow through a switch and voltage at both sides, or voltage at end-of-line (EOL) points.

14. The method of claim 12, wherein the electrical grid characterization data is collected at ten to sixty second time intervals.

15. The method of claim 12, further comprising, for each of the transitions, applying a filter to smooth the electrical grid characterization data.

16. The method of claim 12, further comprising repeating the causing, the operations, the calculating, and the determining the performance for a plurality of periods.

17. The method of claim 16, wherein the reductions in energy for the respective periods are aggregated to determine a total reduction in energy for the plurality of periods.

18. The method of claim 12, wherein the method further comprises, for each of the transitions, responsive to the VVO system being off for a predetermined period of time, transition the VVO system from the off state to the on state.

19. The method of claim 18, wherein the predetermined period of time is between five and fifteen minutes.

20. The method of claim 18, wherein the predetermined period of time allows for a higher voltage level to stabilize at a substation bus and for the higher voltage level to transition to end-of-line (EOL) points.

* * * * *